United States Patent

[11] 3,569,729

[72] Inventors Isamu Washizuka
Osaka-shi;
Hitoshi Hanahara; Kunio Yoshida,
Yamatokoriyama-shi, Japan
[21] Appl. No. 649,248
[22] Filed June 27, 1967
[45] Patented Mar. 9, 1971
[73] Assignee Hayakawa Denkikogyo Kabushiki Kaisha
Osaka-shi, Osaka-Fu, Japan
[32] Priority July 5, 1966
[33] Japan
[31] 41/44305

[54] INTEGRATED FET STRUCTURE WITH SUBSTRATE BIASING MEANS TO EFFECT BIDIRECTIONAL TRANSISTOR OPERATION
4 Claims, 19 Drawing Figs.

[52] U.S. Cl. .......... 307/205,
307/213, 307/251, 307/296, 307/304, 307/279
[51] Int. Cl. .......... H03k 19/08
[50] Field of Search .......... 307/205,
251, 279, 304, 215, 296; 317/235, 211

[56] References Cited
UNITED STATES PATENTS

| | | | |
|---|---|---|---|
| 3,355,598 | 11/1967 | Tuska .......... | 307/251X |
| 3,365,707 | 1/1968 | Mayhew .......... | 307/205X |
| 3,414,740 | 12/1968 | Dailey et al. .......... | 307/304 |
| 3,427,445 | 2/1969 | Dailey .......... | 307/205X |
| 3,233,123 | 2/1966 | Heiman .......... | 307/215X |

*Primary Examiner*—John S. Heyman
*Attorney*—Eugene E. Geoffrey, Jr.

ABSTRACT: An integrated semiconductor circuit wherein a plurality of field effect transistors are formed on a single substrate, terminals are connected to selected electrodes of said transistors and to said substrate and means are provided for biasing the substrate relative to the electrodes of the transistors so that modifying the biasing of the substrate relative to the transistor electrodes will enable bidirectional operation of the transistors.

INVENTORS
ISAMU WASHIZUKA
HITOSHI HANAHARA
BY KUNIO YOSHIDA
ATTORNEY

INVENTORS
ISAMU WASHIZUKA
HITOSHI HANAHARA
BY KUNIO YOSHIDA

ATTORNEY

INVENTORS
ISAMU WASHIZUKA
HITOSHI HANAHARA
BY KUNIO YOSHIDA
ATTORNEY

INVENTORS
ISAMU WASHIZUKA
HITOSHI HANAHARA
BY KUNIO YOSHIDA
ATTORNEY

INTEGRATED FET STRUCTURE WITH SUBSTRATE BIASING MEANS TO EFFECT BIDIRECTIONAL TRANSISTOR OPERATION

This invention relates to a semiconductor integrated circuit arrangement and, more specifically to a novel and improved circuit utilizing integrated semiconductors which are arranged so that a variety of functions can be attained by a single semiconductor configuration.

Circuits utilizing integrated semiconductor elements have been extensively investigated since such circuitry is particularly useful in small electronic computers, such as table types and the like, and these investigations have included the use of such circuits in digital computers. Substantial development has also been directed to the utilization of integrated semiconductors for gates, inverters, and the like, utilizing MOS field effect transistors. Known semiconductor integrated circuits have only been useful in the performance of a single circuit function, and, accordingly, have presented numerous disadvantages. Therefore, it has been necessary to use a relatively large number and types of circuits in order to perform the desired functions. Another difficulty heretofore encountered with integrated semiconductors is that a single evaporation mask can be used to make only a few devices, and thus the manufacturing cost of such semiconductor integrated circuits is extremely expensive.

One object of this invention resides in the provision of an improved integrated semiconductor device which is constructed and arranged to enable its use in the performance of a variety of different functions.

A further object of the invention resides in a novel and improved structure wherein a number of semiconductor devices are formed on a single semiconductor substrate and enables circuit arrangements utilizing a single integrated semiconductor structure to perform a variety of functions. In accordance with the invention, a host electrode or substrate in an MOS type integrated semiconductor circuit is arranged independently of the other electrodes to provide an adaptable circuit structure which can exhibit various functions. This is accomplished by utilizing the nondirectionality characteristic of an MOS field effect transistor since there is no DC coupling between the respective gate terminals and the source or drain terminals. A circuit device in accordance with the invention is constituted so that it can perform a substantial variety of functions by providing mutual connections between a plurality of internal elements. In accordance with the invention, the semiconductor device includes a plurality of terminals which enables it to be readily utilized as a gate inverter or other type of circuit element in a digital computer by properly selecting the input and output terminals, source terminals and ground terminals. In other words, with prior known devices the terminal arrangements limit the utilization of each terminal to its inherent function but with the structure in accordance with this invention, a terminal may constitute an input terminal or a source terminal depending on the nature of the application.

The above and other objects and advantages of this invention will become more apparent from the following description and accompanying drawings forming part of this application.

Figures 1, 2, 4, 6:
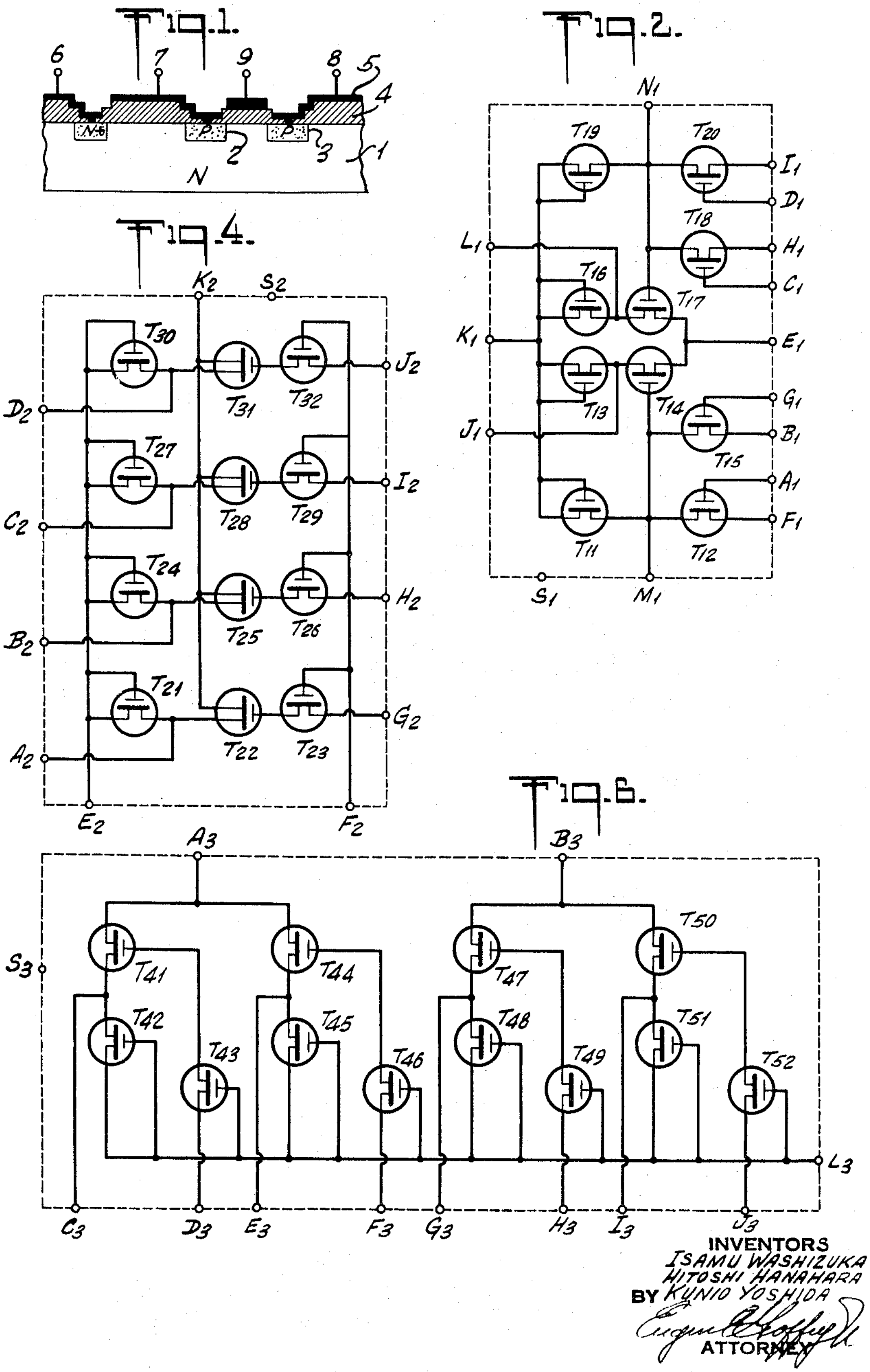
FIG. 1 is a diagrammatic cross-sectional view of an MOS field effect transistor comprising a plurality of individual elements in accordance with the invention.
FIG. 2 is a circuit diagram embodying an integrated semiconductor device in accordance with the invention.

FIGS. 3A—3D are circuit diagrams utilizing the integrated semiconductor in various applications;

FIG. 4 is a circuit diagram utilizing another embodiment of an integrated semiconductor device in accordance with the invention;

FIGS. 5A—5F illustrate various circuit diagrams of the integrated semiconductor structure of FIG. 4;

FIG. 6 is a circuit diagram utilizing still another embodiment of an integrated semiconductor device in accordance with the invention; and FIGS. 7A—7E illustrate circuit diagrams utilizing the integrated semiconductor device of FIG. 6.

Referring now to FIG. 1, the numerals 2 and 3 denote P-type diffusion layers which serve as the source and drain electrodes, respectively. These electrodes are deposited on the surface of an N-type semiconductor substrate 1, and a metal layer 5 which may serve as a gate electrode is deposited through an insulating oxide layer 4 over the P-type diffusion layers 2 and 3. This device includes a substrate terminal 6 connected to the semiconductor substrate 1 through an N+-type diffusion layer. A source terminal 7 and a drain terminal 8 are connected to the substrate through the P-type layers 2 and 3 while the gate terminal 9 overlies the oxide layer 4. The substrate terminal 6 is connected to the integrated device in a manner similar to the terminals 7, 8, and 9. In this way, the nondirectionality of the field effect transistor can be utilized. Furthermore, the DC coupling between the gate terminal 9 and the source terminal 7 or the drain terminal 8 is eliminated and thus many functions are obtainable in both the vertical and horizontal directions.

in FIG. 2, for simplification purposes, the respective structural elements are field effect transistors of the P-channel enhancement type so that 0 volts corresponds to the binary 1 and $-V_{DD}$ volts correspond to the binary 0. The illustrated device includes 10 MOS field effect transistors and is provided with fifteen terminals , $A_1$ through $S_1$ which are connected to respective electrode terminals of the various transistors and serve as external terminals. This device may be used to perform many circuit functions, such as 2 AND −2 OR gate, 3 AND gate, 4 AND −2 OR gate, inversion amplification, gates for addition and subtraction, etc., by properly selecting the input and output and source terminals, and the like.

The circuit shown in FIG. 2 includes two sets of symmetrical circuits, each set having five field effect transistors and having the following internal connections. For convenience, the gate electrode of each transistor will be referred to as the 'first' electrode, the drain electrode as the 'second' electrode and the source electrode as the 'third' electrode. In FIG. 2, it will be observed that the first and third electrodes of the transistor $T_1$1 are mutually connected and the second electrode is connected to the third electrode of transistor $T_1$2. The first and second electrodes of the transistor $T_1$2 form output terminals $A_1$ and $F_1$, respectively. The first and third electrodes of the transistor $T_{13}$ are mutually connected and are, in turn, connected to the first and third electrodes of transistor $T_{11}$ and also form an output terminal $K_1$. The second electrode of transistor $T_{13}$ is connected to the third electrode of transistor $T_{14}$ and this connection forms an output terminal $J_1$. The first electrode of element $T_{14}$ is connected to the third electrodes of transistors $T_{12}$ and $T_{15}$ and forms an output terminal $M_1$. The third electrode of the transistor $T_{14}$ and the first and second electrodes of $T_{15}$ from output terminals $E_1$, $G_1$, and $B_1$, respectively.

Examples of the utilization of the foregoing device are as follows.

EXAMPLE 1

Figure 3A:
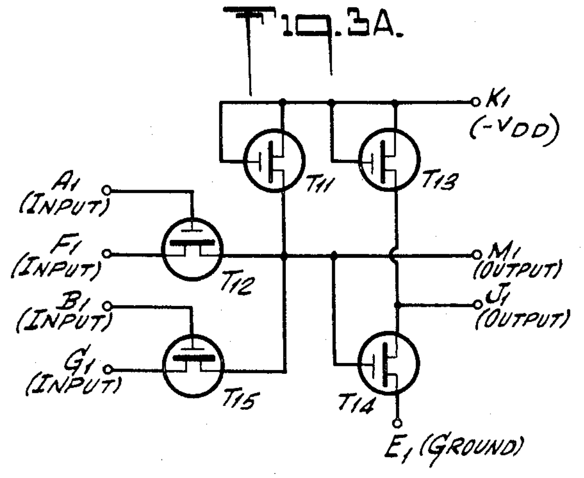

With reference to FIG. 3A, the terminal $K_1$ is connected to a potential source $-V_{DD}$ and the terminal $E_1$ is grounded. If terminals $A_1$, $B_1$, $C_1$, $D_1$, $F_1$, $G_1$, $H_1$, and $I_1$ are used as input terminals and the terminals $M_1$, $N_1$, $J_1$, and $L_1$ are used as output terminals, the logic equations are as follows:

$$M=\overline{A}F+\overline{B}G$$

$$N=\overline{C}H+\overline{D}I$$

$$J=\overline{M}=\overline{\overline{A}F}\times\overline{\overline{B}G}=(A+\overline{F})(B+\overline{G})$$

$$L=\overline{N}=\overline{\overline{C}H}\times\overline{\overline{D}I}=(C+\overline{H})(D+\overline{I})$$

Thus it is evident that the circuit functions as an amplifier comprising 2 AND −2 OR gates (one of the two AND gates includes a NO signal exclusive logic gate, an inverter and a two-stage inverter based upon an AND circuit and a NAND circuit.

EXAMPLE 2

Figure 3C:
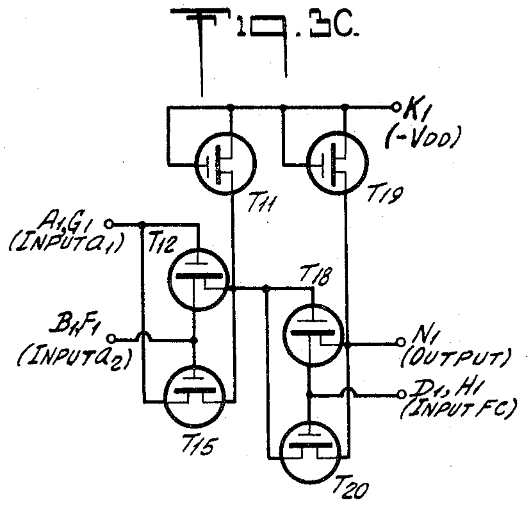
Figure 3B:
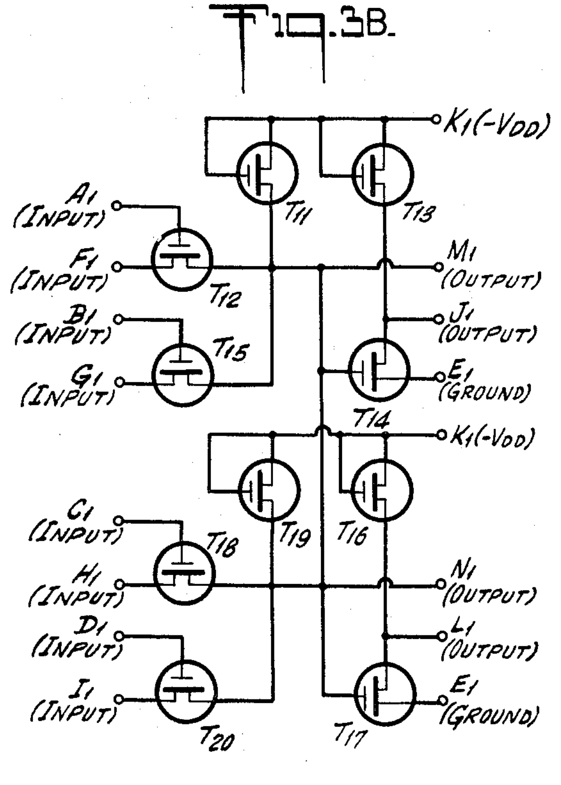

With reference to FIG. 3B which utilizes as part thereof the circuit arrangement of example 1, the terminals $M_1$ and $N_1$ are connected together and the terminals $M_1$, $N_1$, $J_1$ and $L_1$ are used as the output terminals. With this arrangement, the logic equations are as follows:

$$M=N=\overline{A}F+\overline{B}G+\overline{C}H+\overline{D}I$$

$J=L=\overline{M}(A+\overline{F})(B+\overline{G})(C+\overline{H})(D+\overline{I})$ With this arrangement, the circuit functions of 2 AND −2 OR gate (the input of the two AND gates is a so-called truth signal corresponding to 0 volts which is the binary numeral 1). Three AND 4 AND gates (both truth and NO signals are possible) are provided.

EXAMPLE 3

As illustrated in FIG. 3C which constitutes a portion of the circuit of example 2, the connection between the terminals $M_1$ and $N_1$ is removed. Under this condition, a complemental signal of example 2 can be derived even if the two-stage inverter is removed. That is, if two inputs are $a_1$ and $a_2$ and $A_1 = G_1 = a_1$, $B_1 = F_1 = a_2$, $M_1 = C_1 = I_1$ and $H_1 = D_1 = FC$ (carry flip-flop) then the next signal is derived from the terminal $N_1$ and the circuit function is a pure binary three input adder functioning in accordance with the following equation:

$FA=a_1\overline{a}_2\overline{F}G+\overline{a}_1a_2\overline{F}C+\overline{a}_1\overline{a}_2FC+a_1a_2FC$ In the case where the connections to the source side are also used as input terminals, if the logic circuit includes a transistor having its drain side common to that of said transistor it becomes an exclusive logic circuit and it would be necessary to insert a diode whose cathode is in the source side. This prevents an influence of the signal applied from one of the source sides on the signal supply and thereby on the other source side.

EXAMPLE 4

Figure 3D:
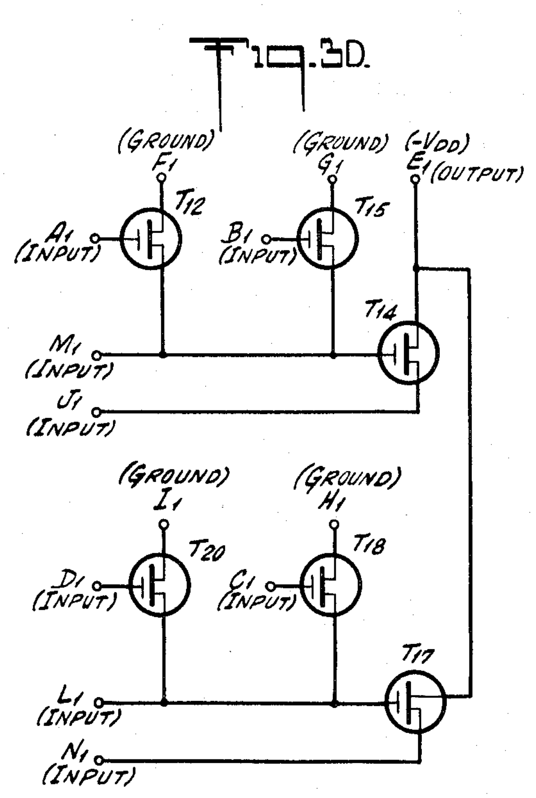

As shown in FIG. 3D, the terminals $K_1$, $F_1$, $G_1$, $H_1$ and $I_1$ are grounded and the terminals $J_1$, $M_1$, $L_1$, $N_1$, $A_1$, $B_1$, $C_1$, and $D_1$ are used as input terminals and the terminal $E_1$ is connected to the source $-V_{DD}$ and used as an output terminal then the logic equation is as follows:

$$E=J\overline{M}AB=L\overline{N}CD$$

Thus a circuit function of 4 AND −2 OR gates including one NO signal is provided. If the terminals $M_1$ and $N_1$ are opened, the following equation is established and 3 AND −2 OR gates according to the truth signal is constituted. The equation is as follows:

$$E=JAB=LCD$$

In the foregoing case, it is necessary to add resistors to the terminals $M_1$, $N_1$, and $E_1$ and in the case of the source of the transistor used as an input terminal it is necessary to insert a diode.

The arrangement shown in FIG. 4 constitutes another embodiment of an integrated semiconductor circuit arrangement according to the invention. In this case, the integrated semiconductor device includes 12 MOS field effect transistors $T_{21}$ 21 to $T_{32}$ and 12 external terminals $A_2$ through $S_2$. This circuit provides circuit functions including dynamic memory, static memory, inversion and the like by properly selecting input and output terminals, source terminals and grounding terminals.

The circuit consists of four sets of symmetrical circuits and each set includes three field effect transistors having internal connections as follows. The first and third electrodes of the first transistor $T_{21}$ are connected together and to an external terminal $A_2$. The second electrode of transistor $T_{21}$ is connected to the third electrode of transistor $T_{22}$ and then to an external terminal $A_2$. The first electrode of the transistor $T_{22}$ is connected to the third electrode of transistor $T_{23}$ The second electrode of transistor $T_{23}$ is independently connected to an external terminal $G_2$. The third electrode of transistor $T_{22}$ and the first electrode of transistor $T_{23}$ are, respectively, connected to external conductors $K_2$ and $F_2$, respectively, which are also common to the other sets of transistors.

EXAMPLE 5

Figures 5A, 5B, 5C, 5D, 5E, 5F:
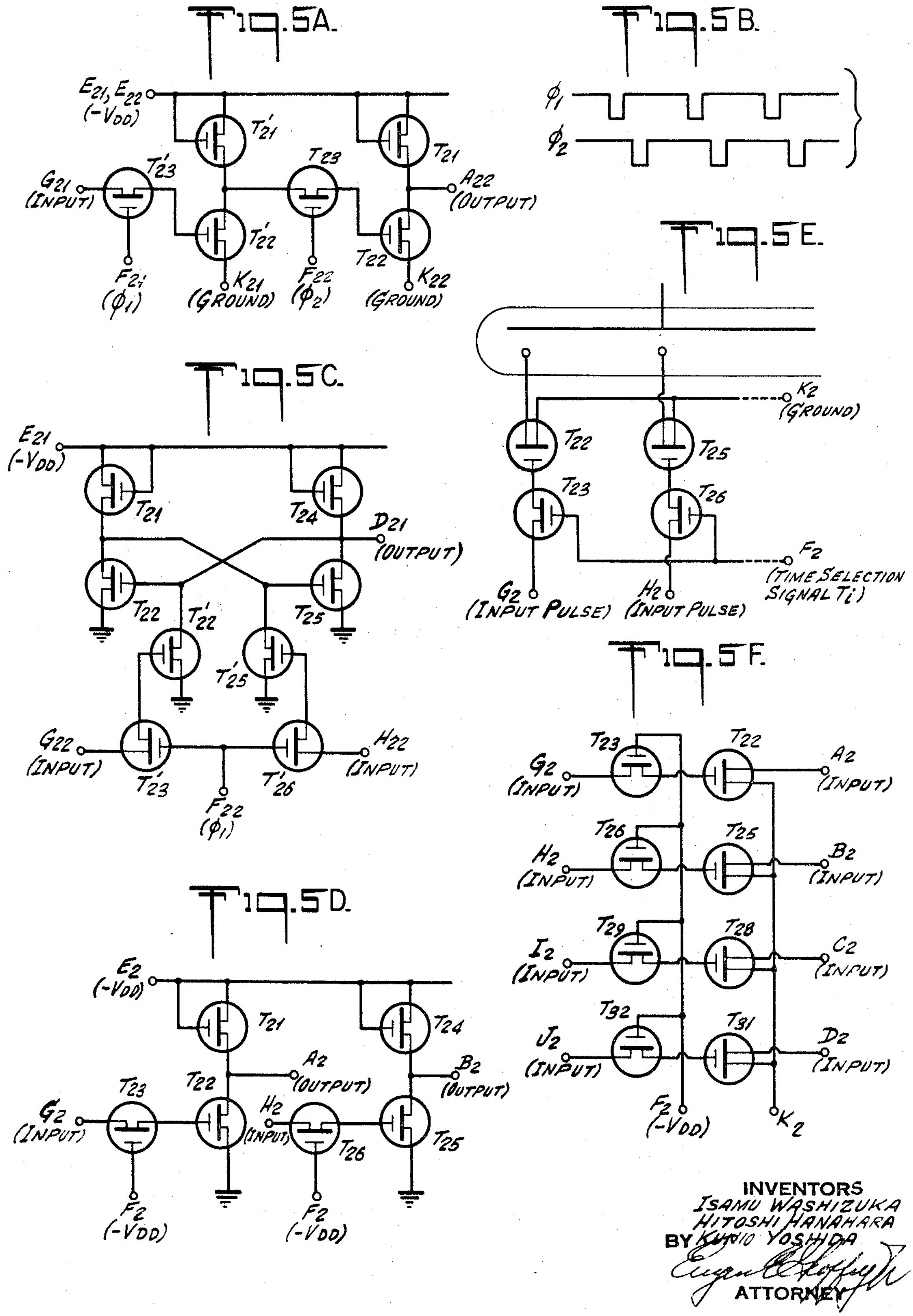

Referring now to FIG. 5A which includes two sets of transistors shown in FIG. 4, there is one set of terminals $A_{21}$, $B_{21}$, etc., and a second set of terminals $A_{22}$, $B_{22}$, etc. The symbols $A_2$, $B_2$, etc., are obtained by removing the second numerals and thereby indicate their correspondence to the terminals shown in FIG. 4. The terminal $E_2$ is connected to the source $-V_{DD}$ and the terminal $K_2$ is grounded. The terminal $G_{21}$ is used as an input terminal and the terminals $A_{21}$ and $G_{22}$, $A_{22}$ and $H_{21}$, $B_{21}$ and $H_{22}$, $B_{22}$ and $I_{21}$, $C_{21}$ and $I_{22}$, $C_{22}$ and $J_{21}$, $D_{21}$ and $J_{22}$, are, respectively connected to each other. When a synchronizing signal $\Phi_1$ is supplied to terminal $F_{21}$ and another synchronizing signal $\Phi_2$ of a different phase is supplied to the other terminal $F_{22}$, the circuit operates as a four bit dynamic memory (flip-flop) and the output is obtained from the terminal $D_{22}$. FIG. 5B is a chart illustrating the phase relationship of the synchronizing signals $\Phi_1$ and $\Phi_2$.

EXAMPLE 6

Utilizing two sets of transistors shown in FIG. 4 and as illustrated in example 5, an arrangement such as shown in FIG. 5C can be utilized. The terminals are identified by the same symbols utilized in connection with example 5. The terminals $E_{21}$ and $F_{21}$ are connected to the source $-V_{DD}$ and the terminals $K_{21}$, $K_{22}$ and $E_{22}$ are grounded. The terminals $A_{21}$ and $H_{21}$, $B_{21}$ and $G_{21}$, $C_{21}$ and $J_{21}$, $D_{21}$ and $I_{21}$, are respectively, connected to each other and a synchronizing signal $\Phi_1$ is supplied to terminal $F_{22}$. Thus a two bit static flip-flop is provided. In this case, four symmetrical circuit arrangements each including at least three structural elements or transistors are necessary to constitute one bit memory. In this case, since the source $-V_{DD}$ is always applied to the first electrode of the transistor $T_{23}$ and in the first arrangement such transistor serves only as a conductor. Since the first and third electrodes of the transistor $T_{23}$ of the second arrangement are grounded when the transistor is opened these two electrodes do not perform any special circuit operations.

EXAMPLE 7

As shown in FIG 5D, which utilizes the structure of FIG. 4, the terminals $G_2$, $H_2$, $I_2$ and $J_2$ are used as input terminals and the terminals $A_2$, $B_2$, $C_2$ and $D_2$ are used as output terminals. Thus four inverters are obtained. In this case, however, the terminal $F_2$ is connected to the source $-V_{DD}$.

EXAMPLE 8

As shown in FIG. 5E and again utilizing the structural arrangement of FIG. 4, the terminals $E_2$ and $K_2$ are grounded. If a dynamic pulse is applied to the terminals $G_2$, $H_2$, $I_2$ and $J_2$ and a time selection signal $T_1$ is applied to the terminal $F_2$ staticized output signals are obtained from the output terminals $A_2$, $B_2$, $C_2$, and $D_2$ by reason of the storing action of the field effect transistor. The staticized signals can be utilized as driving signals in the event that the memory content of the dynamic memory is to be indicated by a display tube of the time division control type. Thus, the semiconductor integrated circuit arrangement may be utilized as a display tube driving circuit device. In this case, however, the transistor $T_{23}$ is not utilized.

EXAMPLE 9

With reference to FIG. 5F, when the terminal $F_2$ is connected to the source $-V_{DD}$and the terminals $A_2$, $B_2$, $C_2$, $D_2$, $G_2$, $H_2$, $I_2$, and $J_2$ are used as input terminals, the logic equation may be set forth as follows:

$$K=\bar{G}A+\bar{H}B+\bar{I}C+\bar{J}D$$

Thus 2 AND—4 OR gates are provided. In this instance, it is of course necessary to connect diodes having their cathodes connected in the same manner are previously described.

Referring now to FIG. 6, there is illustrated still another embodiment of the integrated semiconductor circuit arrangement in accordance with the invention. This circuit includes 12 MOS-type N-channel field effect transistors $T_{41}$ through $T_{52}$ and 12 terminals $A_3$ through $S_3$ which may be used in a variety of arrangements. By properly selecting input, output and source terminals, and the like, from the terminals $A_3$ through $S_3$, many circuit functions may be obtained, such as inversion, display tube driver, transistor gate, exclusive logic gate, etc.

This circuit arrangement comprises four blocks of symmetrical circuits with each block comprising three field effect transistors having internal connections as follows. The first block includes transistors $T_{41}$, $T_{42}$, and $T_{43}$. The first electrode of transistor $T_{41}$ is connected to the third electrode of transistor $T_{43}$ and the second electrode of transistor $T_{41}$ is connected to the third electrode of transistor $T_{42}$ and to external terminal $C_3$. The first and second electrodes of transistor $T_{42}$ are connected to the first electrode of transistor $T_{43}$ and to the output terminal $L_3$. The second electrode of the transistor $T_{43}$ is connected to the external terminal $D_3$. The third electrode of the transistor $T_{41}$ is connected to the third electrode of transistor $T_{44}$ and also to the external terminal $A_3$. The substrate is connected with the terminal $S_3$. The terminal $S_3$ is always grounded. This circuit arrangement can be used in the following manner.

EXAMPLE 10

The arrangement shown in FIG. 6 can operate as an inverter utilizing terminal connections as follows. Terminals $A_3$, $B_3$ and $S_3$ are grounded and terminal $L_3$ is connected to a source $V_{DD}$. The terminals $D_3$, $F_3$, $H_3$ and $J_3$ are used as input signal receiving terminals and the terminals $C_3$, $E_3$, $G_3$ and $I_3$ are used as output terminals. For example, if an input signal $a_1$ is supplied to the terminal $D_3$, the transistor $T_{41}$ operates as a transistor inverter and the transistor $T_{42}$ operates as its load resistor. An output signal $\bar{a}_1$ is obtained from the terminal $C_3$. This arrangement is essentially equivalent to that described in FIG. 5D, referred to above.

EXAMPLE 11

Utilizing the following terminal connections, the arrangement of FIG. 6 will operate as a display tube driver. Terminals $A_3$, $B_3$ and $S_3$ are grounded. Terminals $D_3$, $F_3$, $H_3$ and $J_3$ are used as input signal receiving terminals, terminal $L_3$ is used as a timing signal receiving terminal and terminals $C_3$, $E_3$, $G_3$ and $I_3$ are used as output terminals. One set of transistors $T_{41}$, $T_{42}$ and $T_{43}$ operate as a display tube driver in the manner shown in FIG. 7A and the signal wave forms are illustrated in FIG. 7B.

Figure 7A:
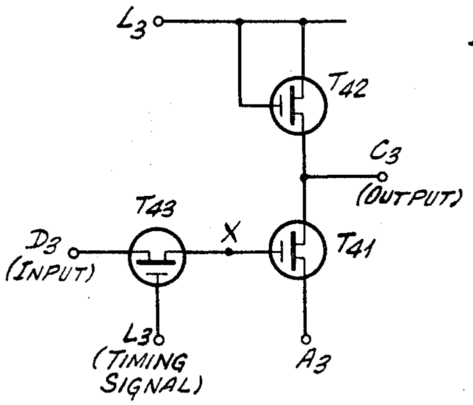
Figure 7B:
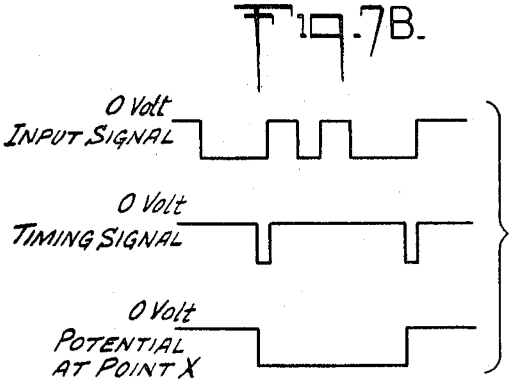

When an input signal is supplied to terminal $D_3$ and a timing signal is applied to terminal $L_3$ then since the transistor $T_{43}$ is driven into an ON state during the $T_{43}$ which the timing signal exists, the input signal is transmitted to a point X as illustrated in FIG. 7A. This signal is stored at point X, because of the internal capacitance of the MOS field effect transistor and the termination of the timing signal inasmuch as the transistor $T_43$ is cut off. Therefore, this arrangement operates as a dynamic display tube driver and element $T_{42}$ operates as a load for the transistor $T_{41}$.

EXAMPLE 12

Figure 7C:
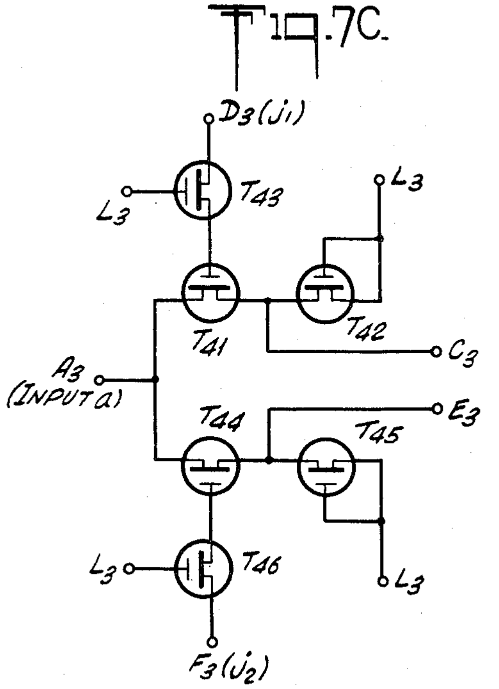
Figure 7E:
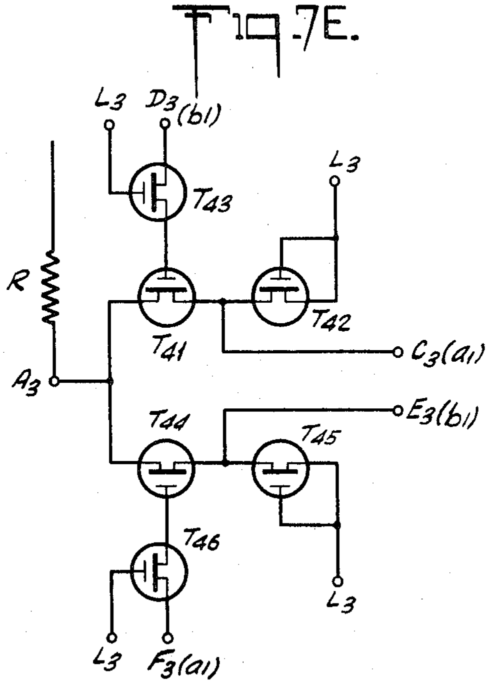
Figure 7D:
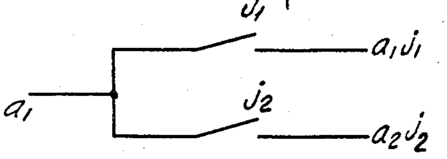

In this Example, the terminal $S_3$ is grounded and the terminal $L_3$ is connected to the source $V_{DD}$. The terminals $A_3$ and $B_3$ are used as receiving terminals for the input signals $a_1$ and $a_2$, respectively. The terminals $D_3$, $F_3$, $H_3$ and $J_3$ are used as receiving terminals of condition input signals, $\bar{j}_1$, $\bar{j}_2$, $\bar{j}_3$, $\bar{j}_4$. Output signals $a_1j_1$, $a_1j_2$, $a_2j_3$, and $a_2j_4$ are obtained from terminals $C_3$, $E_3$, $G_3$ and $I_3$, respectively. Thus as shown in FIG. 7C, the transistors $T_{41}$ through $T_{46}$ provide a transistor gate and switching circuit is shown in FIG. 7D.

EXAMPLE 13

An exclusive OR gate can be arranged by utilizing the bidirectional property of MOS field effect transistors in the following manner. The terminal $S_3$ is grounded and the terminal $L_3$ is connected to the source $V_{DD}$. The terminals $C_3$, $D_3$, $E_3$, $F_3$, $G_3$, $H_3$, $I_3$, and $J_3$ are used as input terminals and terminals $A_3$ and $B_3$ are used as output terminals. In this case, the terminals $C_3$ and $F_3$, $D_3$ and $E_3$, $H_3$ and $I_3$, $G_3$ and $J_3$ are used so that they are equivalent one to the other. A gate circuit comprising the transistors $T_{41}$ through $T_{46}$ is shown in FIG. 7E. If an input signal $a_1$ is supplied to the terminals $C_3$ and $F_3$ and an input signal $b_1$ is supplied to terminals $D_3$ and $E_3$ output $\bar{a}_1b_1+a_1\bar{b}$ is obtained from the output terminal $A_3$ to which an external resistor R is connected.

The structure and operation of integrated semiconductor circuit arrangements in accordance with the invention have been described above, but such descriptions are merely for illustration. Thus the invention provides a single integrated semiconductor arrangement having many applications, advantages and features such as ease of manufacture, simplification of manufacturing jigs and tools, and reduction of manufacturing costs which greatly facilitate mass production.

While only certain embodiments of the invention have been illustrated and described, it is apparent that alterations, modifications and changes may be made without departing from the true scope and spirit thereof as defined by the appended claims.

We claim:

1. A semiconductor integrated circuit comprising a semiconductor substrate of one conductivity type, at least three three effect transistors each having a spaced pair of discrete semiconductor layers of another semiconductor type forming source and drain electrodes and a layer of insulating material therebetween carrying the gate electrode, a plurality of terminals connected to selected electrodes of said transistors, a terminal connected to said substrate, means for applying potentials to said terminals to cause said substrate to have a potential equal to or of opposite polarity to said layers and bidirectional biasing means for modifying the polarity of the potentials applied to said plurality of terminals relative to said substrate terminal to selectively bias the substrate relative to said pairs of spaced layers for providing one layer of each pair to be the source electrode and the other layer of each pair to be the drain electrode when the relative potential is of one polarity, said bidirectional biasing means being further characterized by providing a reversal of the functions of said source and drain layers by causing said one layer of each pair to be the drain electrode and said other layer of each pair to be the source electrode when the relative potential of said substrate terminal is of the other polarity whereby said circuit performs different computer functions.

2. A semiconductor integrated circuit comprising a semiconductor substrate having one conductivity type, at least three field effect transistors each having a source, drain and gate electrode, a plurality of spaced pairs of discrete semiconductor layers of the other conductivity type on said substrate with the layers of each pair being arranged in spaced relationship, a layer of insulating material between the semiconductor layers of each pair and a gate electrode overlying each of said insulating layers, terminal means connected to said substrate and to said source, drain and gate electrodes and means for applying electrical signals thereto with the potential of the substrate being equal or of opposite polarity to that of the potentials of the source and drain electrodes, said transistors thereby isolated one from the other with each transistor having a nondirectional characteristic whereby said transistors may be connected to perform diverse functions in an operative circuit, said substrate including at least five field effect transistors each having a gate, source and drain electrode, a first common connection coupling the gate and source electrodes of the first and third transistors, a second common connection coupling the drain electrode of the first transistor, the source electrode of the second transistor, the gate electrode of the fourth transistor and the source electrode of the fifth transistor, a third common connection between the drain electrode of the third transistor and the source electrode of the fourth transistor and external terminal means connected to the gate and drain electrodes of the second and fifth transistors, to the drain electrode of the fourth transistor, to said second common connection, to said first common connection and to said third common connection.

3. A semiconductor integrated circuit comprising a semiconductor substrate having one conductivity type, at least tree field effect transistors each having a source, drain and gate electrode, a plurality of spaced pairs of discrete semiconductor layers of the other conductivity type on said substrate with the layers of each pair being arranged in spaced relationship, a layer of insulating material between the semiconductor layers of each pair and a gate electrode overlying each of said insulating layers, terminal means connected to said substrate and to said source, drain and gate electrodes and means for applying electrical signals thereto with the potential of the substrate being equal or of opposite polarity to that of the potentials of the source and drain electrodes, said transistors thereby isolated one from the other with each transistor having a nondirectional characteristic whereby said transistors may be connected to perform diverse functions in an operative circuit, said substrate including a plurality of sets of at least three field effect transistors each having a gate, drain and source electrodes, a first connection between the gate and source of the first transistor of each set, a second connection between the drain of said first transistor and the source of the second transistor of each set, a third connection between the gate of the second transistor and the source of the third transistor of each set, a fourth connection interconnecting said first connection of said sets, a fifth connection coupling the drains of the second transistors of said sets, a sixth connection coupling the gates of the third transistors of said sets and external terminals connected to each of said second connections, said fourth connection, said fifth connection, said sixth connection and the drains of each of the third transistors of each set.

4. A semiconductor integrated circuit comprising a semiconductor substrate having one conductivity type, at least three field effect transistors each having a source, drain and gate electrode, a plurality of spaced pairs of discrete semiconductor layers of the other conductivity type on said substrate with the layers of each pair being arranged in spaced relationship, a layer of insulating material between the semiconductor layers of each pair and a gate electrode overlying each of said insulating layers, terminal means connected to said substrate and to said source, drain and gate electrodes and means for applying electrical signals thereto with the potential of the substrate being equal or of opposite polarity to that of the potentials of the source and drain electrodes, said transistors thereby isolated one from the other with each transistor having a nondirectional characteristic whereby said transistors may be connected to perform diverse functions in an operative circuit, said substrate including a plurality of sets of at least three field effect transistors each having gate, drain and source electrodes, a first connection between the gate of the first transistor and the source of the third transistor of each set, a second connection between the drain of the first transistor and the source of the second transistor of each set, a third connection coupling the gate and drain of the second transistor with the gate of the third transistor of each set, a fourth connection coupling said third connections one to the other, a fifth connection interconnecting the sources of the first transistors of said sets and external terminal connected to each of said second connections, said fourth connection, said fifth connection and the drain of the third transistor of each set.